United States Patent
Wang et al.

(10) Patent No.: US 8,796,081 B2
(45) Date of Patent: Aug. 5, 2014

(54) SEMICONDUCTOR STRUCTURE AND METHOD FOR FORMING THE SAME

(75) Inventors: Jing Wang, Beijing (CN); Jun Xu, Beijing (CN); Lei Guo, Beijing (CN)

(73) Assignee: Tsinghua University (CN)

( * ) Notice: Subject to any disclaimer, the term of this patent is extended or adjusted under 35 U.S.C. 154(b) by 0 days.

(21) Appl. No.: 13/499,498

(22) PCT Filed: Sep. 7, 2011

(86) PCT No.: PCT/CN2011/079442
§ 371 (c)(1),
(2), (4) Date: Mar. 30, 2012

(87) PCT Pub. No.: WO2012/129894
PCT Pub. Date: Oct. 4, 2012

(65) Prior Publication Data
US 2012/0280274 A1    Nov. 8, 2012

(30) Foreign Application Priority Data

Mar. 30, 2011 (CN) .......................... 2011 1 0080303

(51) Int. Cl.
*H01L 21/338*    (2006.01)
*H01L 31/00*    (2006.01)

(52) U.S. Cl.
USPC ........... 438/172; 438/191; 438/758; 438/933; 438/778; 257/190

(58) Field of Classification Search
CPC ... H01L 21/337; H01L 21/338; H01L 21/469; H01L 31/00

USPC ...... 257/190, 183, E29.085, 18, 19, 257/E29.193, 347, 620, 707; 438/767, 758, 438/763, 578, 769, 771, 762, 378.44, 441

See application file for complete search history.

(56) References Cited

U.S. PATENT DOCUMENTS

| | | |
|---|---|---|
| 2003/0119280 A1 | 6/2003 | Lee et al. |
| 2003/0215990 A1* | 11/2003 | Fitzgerald et al. ............ 438/172 |
| 2004/0161947 A1* | 8/2004 | Fitzergald ...................... 438/778 |
| 2004/0259315 A1 | 12/2004 | Sakaguchi et al. |
| 2007/0164358 A1 | 7/2007 | de Souza et al. |
| 2007/0272944 A1* | 11/2007 | Notsu et al. ................... 257/190 |
| 2010/0044836 A1 | 2/2010 | Damlencourt et al. |

FOREIGN PATENT DOCUMENTS

| | | |
|---|---|---|
| CN | 101005052 A | 7/2007 |
| JP | 2006253605 A | 9/2006 |

OTHER PUBLICATIONS

International Seach Report and Written Opinion for Application No. PCT/CN2011/079442 dated Nov. 17, 2011.

* cited by examiner

*Primary Examiner* — Steven Loke
*Assistant Examiner* — Mouloucoulaye Inoussa
(74) *Attorney, Agent, or Firm* — Lerner, David, Littenberg, Krumholz & Mentlik, LLP

(57) ABSTRACT

A semiconductor structure is provided, comprising: a Si substrate; a porous structure layer formed on the Si substrate, in which the porous structure layer has a flat surface and comprises a $Si_{1-x}Ge_x$ layer with low Ge content; and a Ge-containing layer formed on the porous structure layer, in which the Ge containing layer comprises a Ge layer or a $Si_{1-y}Ge_y$ layer with high Ge content and x≤y. Further, a method for forming the semiconductor structure is also provided.

3 Claims, 5 Drawing Sheets

SEMICONDUCTOR STRUCTURE AND METHOD FOR FORMING THE SAME

CROSS-REFERENCES TO RELATED APPLICATIONS

The present application is a national phase entry under 35 U.S.C. §371 of International Application No. PCT/CN2011/079442 filed on Sep. 7, 2011 which claims priority from Chinese Patent Application No. 201110080303.5 filed on Mar. 30, 2011, all of which are incorporated herein by reference.

FIELD

The present disclosure relates to a semiconductor manufacture and design, and more particularly to a semiconductor structure and a method for forming the same.

BACKGROUND

For a long time, a feature size of a metal-oxide-semiconductor field-effect transistor (MOSFET) is scaled down according to Moore's law, and a working speed of the MOSFET is faster and faster. However, physical and technical limits of Si materials have been reached. Therefore, in order to improve a performance of the MOSFET, various methods have been proposed, and consequently a More-than-Moore era has come. Among them, an effective technology is a high-mobility channel engineering based on heterogeneous materials, particularly, high-carrier-mobility materials such as Si—Ge materials and III-V compound materials.

Because lattice constant of Si is different from Ge and Group III-V compound semiconductor materials, there is a high density dislocation in Ge or III-V compound film heterogeneously integrated on Si substrate, and consequently serious scattering and leakage may be caused, thus influencing a performance of a device.

SUMMARY

The present disclosure is aimed to solve at least one of the above mentioned technical problems.

According to an aspect of the present disclosure, a semiconductor structure is provided, comprising: a Si substrate; a porous structure layer formed on the Si substrate, wherein the porous structure layer has a flat surface and comprises a $Si_{1-x}Ge_x$ layer with low Ge content; and a Ge-containing layer formed on the porous structure layer, wherein the Ge-containing layer comprises a Ge layer or a $Si_{1-y}Ge_y$ layer with high Ge content and $x \leq y$.

In one embodiment, the flat surface is formed by annealing the porous structure layer in a hydrogen ambience.

In one embodiment, the flat surface is formed by annealing the porous structure layer in a hydrogen ambience containing $SiH_4$ and/or $GeH_4$.

In one embodiment, the semiconductor structure further comprises: a Si layer or a SiGe layer with low Ge content formed between the porous structure layer and the Ge-containing layer; and/or a strontium germanide layer, a barium germanide layer, a stannum germanide layer, a SiGe passivation layer with low Ge content or a Si passivation layer formed on the Ge-containing layer.

According to another aspect of the present disclosure, a method for forming a semiconductor structure is provided, comprising steps of: providing a Si substrate; forming a porous structure layer on the Si substrate, wherein the porous structure layer has a flat surface and comprises a $Si_{1-x}Ge_x$ layer with low Ge content; and forming a Ge-containing layer on the porous structure layer, wherein the Ge-containing layer comprises a Ge layer or a $Si_{1-y}Ge_y$ layer with high Ge content and $x \leq y$.

In one embodiment, the flat surface is formed by annealing the porous structure layer in a hydrogen ambience.

In one embodiment, the flat surface is formed by annealing the porous structure layer in a hydrogen ambience containing $SiH_4$ and/or $GeH_4$.

In one embodiment, the method further comprises: forming a Si layer or a SiGe layer with low Ge content on the porous structure layer; and/or forming a strontium germanide layer, a barium germanide layer or a stannum germanide layer on the Ge-containing layer, or forming a SiGe passivation layer with low Ge content or a Si passivation layer on the Ge-containing layer.

According to still another aspect of the present disclosure, a semiconductor structure is provided, comprising: a Si substrate; a plurality of isolation structures formed on the Si substrate and spaced apart from each other by a predetermined pattern, wherein a growth region is formed between every two adjacent isolation structures; a porous structure layer formed in the growth region, wherein the porous structure layer has a flat surface and comprises a $Si_{1-x}Ge_x$ layer with low Ge content; and a Ge-containing layer formed on the porous structure layer, wherein the Ge-containing layer comprises a Ge layer or a $Si_{1-y}Ge_y$ layer with high Ge content and $x \leq y$.

In one embodiment, the flat surface is formed by annealing the porous structure layer in a hydrogen ambience.

In one embodiment, the flat surface is formed by annealing the porous structure layer in a hydrogen ambience containing $SiH_4$ and/or $GeH_4$.

In one embodiment, the semiconductor structure further comprises: a Si layer or a SiGe layer with low Ge content formed between the porous structure layer and the Ge-containing layer; and/or a strontium germanide layer, a barium germanide layer, a stannum germanide layer, a SiGe passivation layer with low Ge content or a Si passivation layer formed on the Ge-containing layer.

According to yet another aspect of the present disclosure, a method for forming a semiconductor structure is provided, comprising steps of: providing a Si substrate; forming an insulation layer on the Si substrate; etching the insulation layer to form a plurality of isolation structures spaced apart from each other by a predetermined pattern, wherein a growth region is formed between every two adjacent isolation structures; depositing a first material layer in the growth region, wherein the first material layer comprises a $Si_{1-x}Ge_x$ layer with low Ge content; anodizing the first material layer to form a porous structure layer, wherein the porous structure layer has a flat surface; and forming a Ge-containing layer on the porous structure layer, wherein the Ge-containing layer comprises a Ge layer or a $Si_{1-y}Ge_y$ layer with high Ge content and $x \leq y$.

In one embodiment, the flat surface is formed by annealing the porous structure layer in a hydrogen ambience.

In one embodiment, the flat surface is formed by annealing the porous structure layer in a hydrogen ambience containing $SiH_4$ and/or $GeH_4$.

In one embodiment, the method further comprises: forming a Si layer or a SiGe layer with low Ge content on the porous structure layer; and/or forming a strontium germanide layer, a barium germanide layer or a stannum germanide layer on the Ge-containing layer, or forming a SiGe passivation layer with low Ge content or a Si passivation layer on the Ge-containing layer.

With the semiconductor structure according to an embodiment of the present disclosure, by the porous structure layer (for example, a SiGe layer) formed on the Si substrate, a dislocation between the Si substrate and the Ge-containing layer (for example, a Ge layer) may be effectively reduced, and consequently a leakage of the device may be alleviated, thus improving the performance of the device. In addition, according to an embodiment of the present disclosure, the porous structure layer may be processed with a selective epitaxy, and a part of dislocation may be isolated by isolation structures, thus further improving the performance of the device.

Moreover, according to an embodiment of the present disclosure, by the Si layer or the SiGe layer with low Ge content formed between the porous structure layer and the Ge-containing layer, a leakage at an interface between the porous structure layer and the Ge-containing layer may be effectively inhibited.

Furthermore, the strontium germanide layer, the barium germanide layer, the stannum germanide layer, the SiGe passivation layer with low Ge content or the Si passivation layer formed on the Ge-containing layer (for example, a Ge layer) may alleviate interface states between Ge materials and insulating oxides, thus reducing a leakage and a scattering at the interface. According to a preferred embodiment of the present disclosure, because the strontium germanide layer, the barium germanide layer, the stannum germanide layer or the SiGe layer is a Ge-containing layer, the interface states between Ge materials and insulating oxides may be alleviated so as to reduce a leakage and a scattering at the interface, and a mobility of the Ge materials may not be reduced largely.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION

Figure 1:
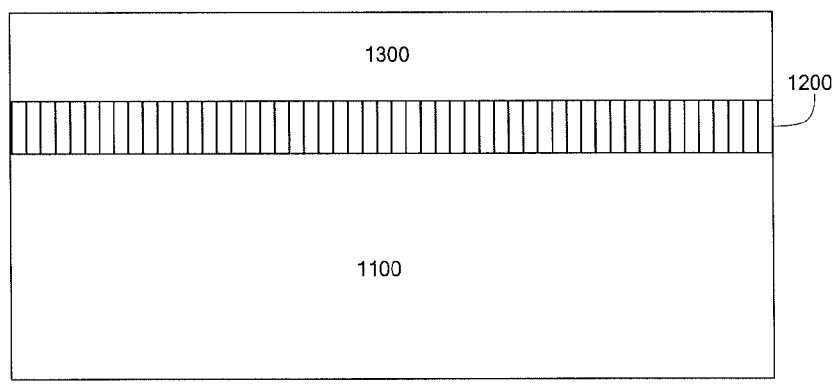
FIG. 1 is a cross-sectional view of a semiconductor structure according to a first embodiment of the present disclosure.

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

Various embodiments and examples are provided in the following description to implement different structures of the present disclosure. In order to simplify the present disclosure, certain elements and settings will be described. However, these elements and settings are only examples and are not intended to limit the present disclosure. In addition, reference numerals may be repeated in different examples in the disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied. Moreover, a structure in which a first feature is "on" a second feature may include an embodiment in which the first feature directly contacts the second feature and may include an embodiment in which an additional feature is prepared between the first feature and the second feature so that the first feature does not directly contact the second feature.

Embodiment 1

FIG. 1 is a cross-sectional view of a semiconductor structure according to a first embodiment of the present disclosure. The semiconductor structure comprises a Si substrate 1100; a porous structure layer 1200 formed on the Si substrate 1100, in which the porous structure layer 1200 has a flat surface and comprises a $Si_{1-x}Ge_x$ layer with low Ge content; and a Ge-containing layer 1300 formed on the porous structure layer 1200, in which the Ge-containing layer 1300 comprises a Ge layer or a $Si_{1-y}Ge_y$ layer with high Ge content and $x \leq y$. A porosity of the porous structure layer 1200 is above about 10%. With the semiconductor structure according to an embodiment of the present disclosure, interface states between the Si substrate 1100 and the Ge-containing layer 1300 may be significantly alleviated. The flat surface may be formed by annealing the porous structure layer 1200 in a hydrogen ambience, or the flat surface may be formed by annealing the porous structure layer in a hydrogen ambience containing $SiH_4$ and/or $GeH_4$, thus facilitating a growth of the Ge-containing layer 1300. A thickness of the porous structure layer 1200 is within a range from 10 nm to 1000 nm.

In this way, the SiGe layer is used as a transition layer, thus further alleviating a scattering and a leakage at an interface between the Si substrate and the Ge-containing layer. As used herein, the term "a SiGe layer with low Ge content" refers to a SiGe layer with a content of Ge lower than 50%, and the term "a SiGe layer with high Ge content" refers to a SiGe layer with a content of Ge higher than 50%.

Figure 2:
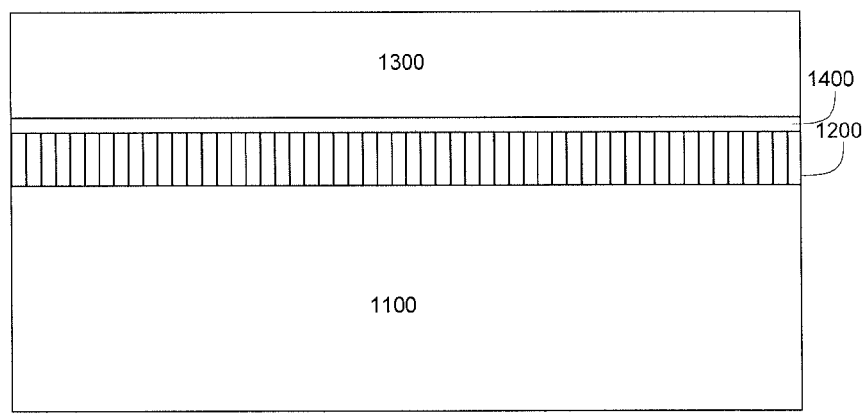
FIG. 2 is a cross-sectional view of another semiconductor structure according to the first embodiment of the present disclosure.

FIG. 2 is a cross-sectional view of another semiconductor structure according to the first embodiment of the present disclosure. In this embodiment, the semiconductor structure further comprises: a Si layer or a SiGe layer with low Ge content 1400 formed between the porous structure layer 1200 and the Ge-containing layer 1300. More preferably, the semiconductor structure further comprises a strontium germanide layer, a barium germanide layer, a stannum germanide layer, a SiGe passivation layer with low Ge content or a Si passivation layer formed on the Ge-containing layer 1300.

Figure 3:
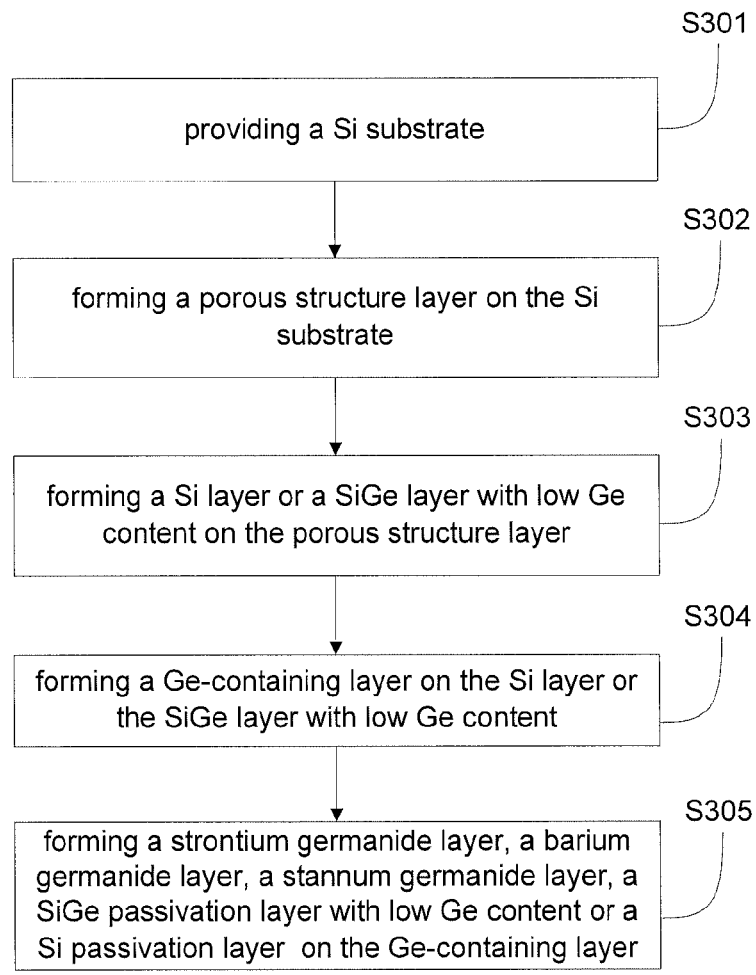
FIG. 3 is a flow chart of a method for forming a semiconductor structure according to the first embodiment of the present disclosure.

FIG. 3 is a flow chart of a method for forming a semiconductor structure according to the first embodiment of the present disclosure. The method comprises the following steps.

Step S301, a Si substrate 1100 is provided.

Step S302, a porous structure layer 1200 is formed on the Si substrate 1100, in which the porous structure layer 1200 has a flat surface. A porosity of the porous structure layer 1200 is above about 10%, and the porous structure layer 1200 comprises a $Si_{1-x}Ge_x$ layer with low Ge content. A content of Ge in the SiGe layer with low Ge content is about 20%-about 50%. In one embodiment, flat surface is formed by annealing the porous structure layer 1200 in a hydrogen ambience or the flat surface is formed by annealing the porous structure layer in a hydrogen ambience containing $SiH_4$ and/or $GeH_4$.

Step S303, a Si layer or a SiGe layer with low Ge content 1400 is formed on the porous structure layer 1200.

Step S304, a Ge-containing layer 1300 is formed on the Si layer or the SiGe layer with low Ge content 1400, and the Ge-containing layer 1300 comprises a Ge layer or a $Si_{1-y}Ge_y$ layer with high Ge content and $x \leq y$.

Step S305, a strontium germanide layer, a barium germanide layer or a stannum germanide layer is formed on the Ge-containing layer 1300, or a SiGe passivation layer with low Ge content or a Si passivation layer is formed on the Ge-containing layer 1300.

With the semiconductor structure according to an embodiment of the present disclosure, by the porous structure layer (for example, a SiGe layer) formed on the Si substrate, a dislocation between the Si substrate and the Ge-containing layer (for example, a Ge layer) may be effectively reduced, and consequently a scattering and a leakage at the interface between the Si substrate and the Ge-containing layer may be alleviated, thus improving a performance of a device.

Embodiment 2

In this embodiment, the porous structure layer may be processed with a selective epitaxy, and a part of dislocation may be isolated by isolation structures, thus further improving the performance of the device.

Figure 4:
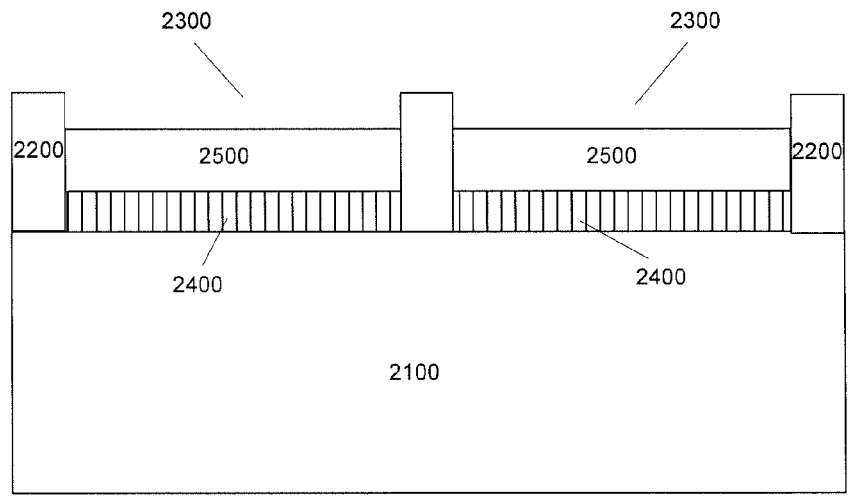
FIG. 4 is a cross-sectional view of a semiconductor structure according to a second embodiment of the present disclosure.

FIG. 4 is a cross-sectional view of a semiconductor structure according to a second embodiment of the present disclosure. The semiconductor structure comprises: a Si substrate 2100; a plurality of isolation structures 2200 formed on the Si substrate 2100 and spaced apart from each other by a predetermined pattern, in which a growth region 2300 is formed between every two adjacent isolation structures 2200; a porous structure layer 2400 formed in the growth region 2300, in which the porous structure layer 2400 has a flat surface and comprises a $Si_{1-x}Ge_x$ layer with low Ge content; and a Ge-containing layer 2500 formed on the porous structure layer 2400, in which the Ge-containing layer 2500 comprises a Ge layer or a $Si_{1-y}Ge_y$ layer with high Ge content and $x \leq y$. A porosity of the porous structure layer 2400 is above about 10%. The flat surface may be formed by annealing the porous structure layer 2400 in a hydrogen ambience or may be formed by annealing the porous structure layer in a hydrogen ambience containing $SiH_4$ and/or $GeH_4$, thus facilitating a growth of the Ge-containing layer 2500. In one embodiment, the isolation structures 2200 may be an insulating first material layer such as a $SiO_2$ layer.

Similarly, in one embodiment, the semiconductor structure further comprises: a Si layer or a SiGe layer with low Ge content formed on the porous structure layer 2400; and a strontium germanide layer, a barium germanide layer, a stannum germanide layer, a SiGe passivation layer with low Ge content or a Si passivation layer formed on the Ge-containing layer 2500.

FIGS. 5-8 are cross-sectional diagrams of intermediate statuses of a semiconductor structure formed during a process of a method for forming the semiconductor structure according to the second embodiment of the present disclosure. The method comprises the following steps.

Step S401, a Si substrate 2100 is provided.

Figure 5:
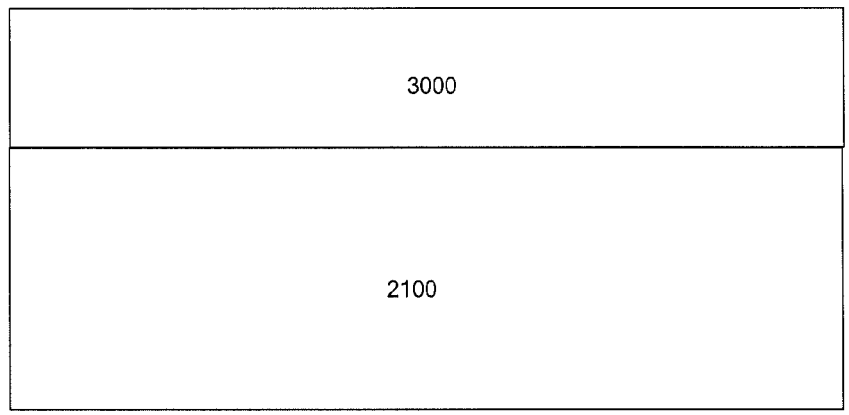
FIGS. 5-8 are cross-sectional diagrams of intermediate statuses of a semiconductor structure formed during a process of a method for forming the semiconductor structure according to the second embodiment of the present disclosure.

Step S402, an insulation layer 3000 is formed on the Si substrate 2100, as shown in FIG. 5. For example, the insulation layer 3000 may be a $SiO_2$ layer.

Figure 6:
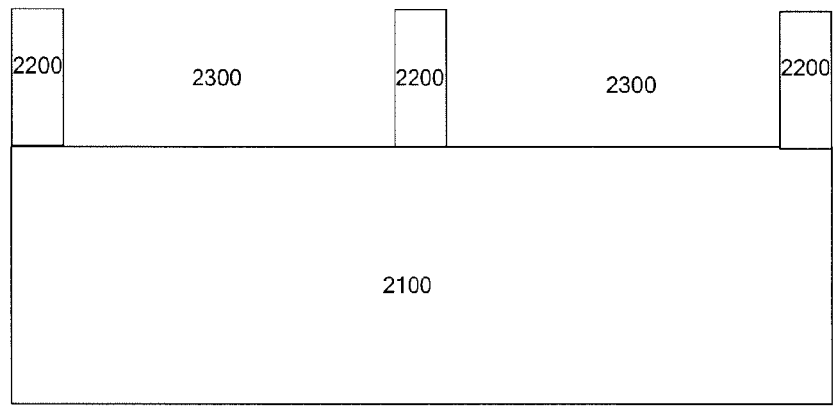

Step S403, the insulation layer 3000 is etched to form a plurality of isolation structures 2200 spaced apart from each other by a predetermined pattern, in which a growth region 2300 is formed between every two adjacent isolation structures 2200, as shown in FIG. 6.

Figure 7:
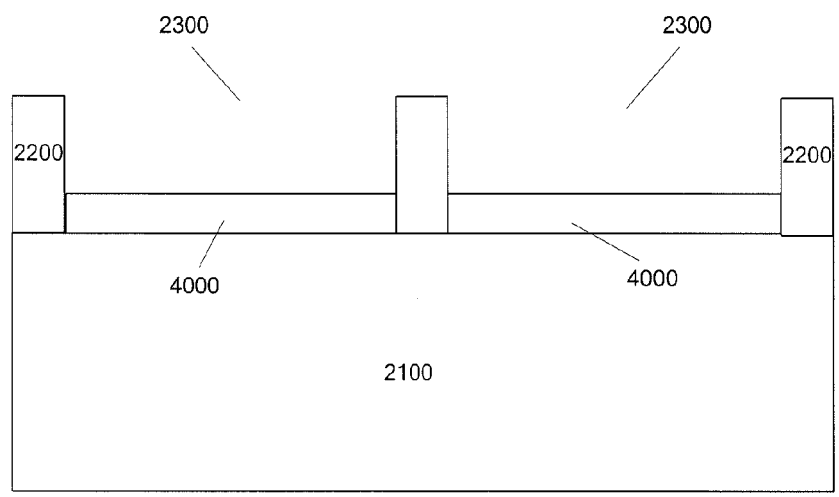

Step S404, a first material layer 4000 is deposited in the growth region 2300, and the first material layer 4000 comprises a $Si_{1-x}Ge_x$ layer with low Ge content, in which a content of Ge is about 20%-about 50%, as shown in FIG. 7.

Figure 8:
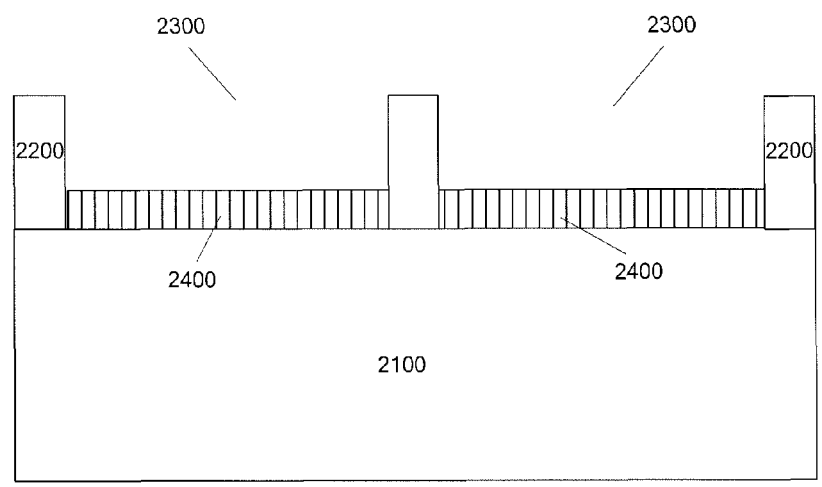

Step S405, the first material layer 4000 is anodized to form a porous structure layer 2400, in which the porous structure layer 2400 has a flat surface. The flat surface is formed by annealing the porous structure layer 2400 in a hydrogen ambience or may be formed by annealing the porous structure layer in a hydrogen ambience containing $SiH_4$ and/or $GeH_4$. A porosity of the porous structure layer 2400 is above about 10%, as shown in FIG. 8.

Step S406, a Ge-containing layer 2500 is formed on the porous structure layer 2400, and the Ge-containing layer 2500 comprises a Ge layer or a $Si_{1-y}Ge_y$ layer with high Ge content and $x \leq y$.

Similarly, in this embodiment, the method further comprises forming a Si layer or a SiGe layer with low Ge content on the porous structure layer 2400 to inhibit a leakage current in the Ge-containing layer 2500.

The method further comprises forming a SiGe passivation layer with low Ge content or a Si passivation layer on the Ge-containing layer 2500 to alleviate interface states between Ge materials and insulating oxides. In one embodiment, a strontium germanide layer, a barium germanide layer or a stannum germanide layer is formed on the Ge-containing layer 2500. Because the strontium germanide layer, the barium germanide layer, a stannum germanide layer or the SiGe layer is a Ge-containing layer, the interface states between Ge materials and insulating oxides may be alleviated so as to reduce a leakage and a scattering at the interface, and a mobility of the Ge materials may not be reduced largely.

According to an embodiment of the present disclosure, the porous structure layer may be processed with a selective epitaxy, and a part of dislocation may be isolated by isolation structures, thus further improving the performance of the device.

With the semiconductor structure according to an embodiment of the present disclosure, by the porous structure layer (for example, a SiGe layer) formed on the Si substrate, a dislocation between the Si substrate and the Ge-containing layer (for example, a Ge layer) may be effectively reduced, and consequently a leakage of the device may be alleviated, thus improving the performance of the device. In addition, according to an embodiment of the present disclosure, the porous structure layer may be processed with a selective epitaxy, and a part of dislocation may be isolated by isolation structures, thus further improving the performance of the device.

Moreover, according to an embodiment of the present disclosure, by the Si layer or the SiGe layer with low Ge content formed between the porous structure layer and the Ge-containing layer, a leakage at an interface between the porous structure layer and the Ge-containing layer may be effectively inhibited. Furthermore, the strontium germanide layer, the barium germanide layer, the a stannum germanide layer, the SiGe passivation layer with low Ge content or the Si passivation layer formed on the Ge-containing layer (for example, a Ge layer) may alleviate interface states between Ge materials and insulating oxides, thus reducing a leakage and a scattering at the interface. According to a preferred embodiment of the present disclosure, because the strontium germanide layer, the barium germanide layer, the stannum germanide layer or the SiGe layer is a Ge-containing layer, the interface states between Ge materials and insulating oxides may be alleviated so as to reduce a leakage and a scattering at the interface, and a mobility of the Ge materials may not be reduced largely.

Although explanatory embodiments have been shown and described, it would be appreciated by those skilled in the art that changes, alternatives, and modifications all falling into the scope of the claims and their equivalents may be made in the embodiments without departing from spirit and principles of the disclosure.

What is claimed is:
1. A semiconductor structure, comprising:
   a Si substrate;
   a plurality of isolation structures formed on the Si substrate and spaced apart from each other by a predetermined pattern, wherein a growth region is formed between every two adjacent isolation structures;
   a porous structure layer formed in the growth region, wherein the porous structure layer has a flat surface and comprises a $Si_{1-x}Ge_x$ layer with low Ge content;
   a Ge-containing layer formed on the porous structure layer, wherein the Ge-containing layer comprises a Ge layer or a $Si_{1-y}Ge_y$ layer with high Ge content and x≤y; and
   at least one of (i) a Si layer or a SiGe layer with low Ge content formed between the porous structure layer and the Ge-containing layer and (ii) a strontium germanide layer, a barium germanide layer, a stannum germanide layer, a SiGe passivation layer with low Ge content or a Si passivation layer formed on the Ge-containing layer.
2. The semiconductor structure according to claim 1, wherein the flat surface is formed by annealing the porous structure layer in a hydrogen ambience.
3. The semiconductor structure according to claim 1, wherein the flat surface is formed by annealing the porous structure layer in a hydrogen ambience containing $SiH_4$ and/or $GeH_4$.

* * * * *